(12) United States Patent
Kwon et al.

(10) Patent No.: US 8,754,686 B2
(45) Date of Patent: Jun. 17, 2014

(54) DELAY CONTROL CIRCUIT AND CLOCK GENERATION CIRCUIT INCLUDING THE SAME

(71) Applicant: SK hynix Inc., Icheon-si (KR)

(72) Inventors: Dae Han Kwon, Icheon-si (KR); Yong Ju Kim, Icheon-si (KR); Jae Min Jang, Icheon-si (KR); Hae Rang Choi, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/711,750

(22) Filed: Dec. 12, 2012

(65) Prior Publication Data

US 2013/0342250 A1    Dec. 26, 2013

(30) Foreign Application Priority Data

Jun. 20, 2012 (KR) .................. 10-2012-0066240

(51) Int. Cl.
*H03L 7/06* (2006.01)
(52) U.S. Cl.
USPC ..................................... 327/158; 327/149
(58) Field of Classification Search
USPC .................... 327/147, 156, 149, 158
See application file for complete search history.

(56) References Cited

U.S. PATENT DOCUMENTS

| | | | |
|---|---|---|---|
| 7,969,214 B2* | 6/2011 | Jang et al. | 327/158 |
| 8,390,350 B2* | 3/2013 | Na | 327/158 |
| 8,502,579 B2* | 8/2013 | Gomm | 327/158 |

FOREIGN PATENT DOCUMENTS

| | | |
|---|---|---|
| KR | 1019960032486 A | 9/1996 |
| KR | 1020000035678 A | 6/2000 |

* cited by examiner

*Primary Examiner* — Hai L Nguyen
(74) *Attorney, Agent, or Firm* — William Park & Associates Patent Ltd.

(57) ABSTRACT

A clock generation circuit includes a delay line, which delays an input clock and generates a delayed clock, a delay modeling unit, which delays the delayed clock by a modeled delay value and generates a feedback clock, a phase detection unit, which compares phases of the input clock and the feedback clock and generates a phase detection signal, a filter unit, which receives the phase detection signal and generates phase information, generates an update signal when a difference between the numbers of phase detection signals with a first and a second level generated is greater than or equal to a threshold value, and generates the update signal after a lapse of a predetermined time when the difference is less than the threshold value, and a delay line control unit, which sets a delay value of the delay line in response to the update signal and the phase information.

28 Claims, 6 Drawing Sheets

DELAY CONTROL CIRCUIT AND CLOCK GENERATION CIRCUIT INCLUDING THE SAME

CROSS-REFERENCES TO RELATED APPLICATION

The present application claims priority under 35 U.S.C. §119(a) to Korean application number 10-2012-0066240, filed on Jun. 20, 2012, in the Korean Intellectual Property Office, which is incorporated herein by reference in its entirety.

BACKGROUND

1. Technical Field

The present invention relates generally to a semiconductor apparatus, and more particularly, to a delay control circuit and a clock generation circuit including the same.

2. Related Art

In general, a semiconductor apparatus utilizing memory performs an operation in synchronization with a clock. In a synchronous type semiconductor apparatus, input and output data should be precisely synchronized with an external clock. The semiconductor apparatus receives the external clock, converts the external clock into an internal clock, and uses the converted internal clock. However, as the internal clock is transmitted through a clock buffer and a transmission line, a phase difference occurs between the internal clock and the external clock. In order to compensate for the phase difference, the semiconductor apparatus generally utilizes a phase-locked loop or a delay-locked loop.

The delay-locked loop may increase an effective data output period by compensating for the phase difference occurring between the internal clock and the external clock. The delay-locked loop moves the phase of the internal clock to precede the phase of the external clock by a predetermined time, such that output data may be outputted synchronized with the external clock.

Figure 1:
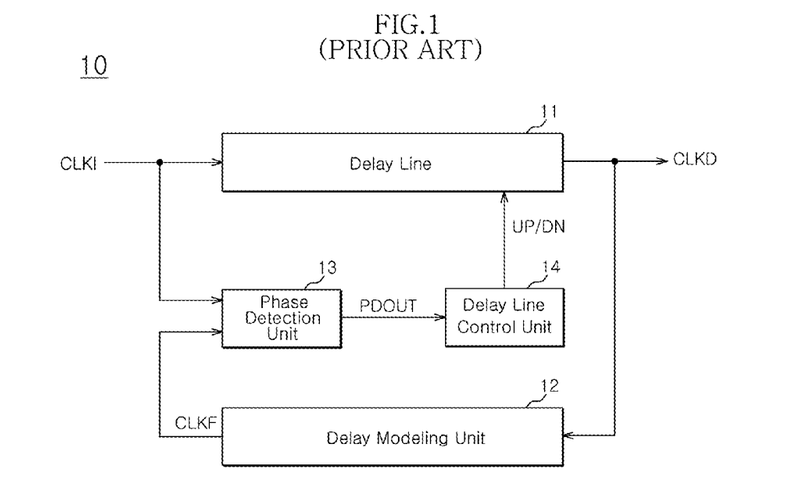
FIG. 1 is a diagram showing the configuration of a conventional delay-locked loop.

FIG. 1 is a block diagram schematically showing the configuration of a conventional delay-locked loop 10. In FIG. 1, the delay-locked loop 10 includes a delay line 11, a delay modeling unit 12, a phase detection unit 13, and a delay line control unit 14. The delay line 11 receives an input clock CLKI, delays it by the value set by the delay line control unit 14, and generates a delayed clock CLKD. The delay modeling unit 12 delays the delayed clock CLKD by a modeled delay value and generates a feedback clock CLKF. The phase detection unit 13 compares the phases of the input clock CLKI and the feedback clock CLKF and generates a phase detection signal PDOUT. The delay line control unit 14 receives the phase detection signal PDOUT and generates a delay control signal UP/DN, which may newly set the delay value of the delay line 11.

SUMMARY

A clock generation circuit for preventing a stuck phenomenon from occurring when the phase of a clock cannot be precisely detected due to jitter of an input clock or power noise is described herein.

In addition, a clock generation circuit capable of performing a precise delay locking operation is described herein.

In an embodiment of the present invention, a clock generation circuit includes: a delay line configured to delay an input clock and generate a delayed clock; a delay modeling unit configured to delay the delayed clock by a modeled delay value and generate a feedback clock; a phase detection unit configured to compare phases of the input clock and the feedback clock and generate a phase detection signal; a filter unit configured to receive the phase detection signal and generate phase information, generate an update signal when a difference between the number of phase detection signals with a first level generated and the number of phase detection signals with a second level generated is greater than or equal to a threshold value, and generate the update signal after a lapse of a predetermined time when the difference is less than the threshold value; and a delay line control unit configured to set a delay value of the delay line in response to the update signal and the phase information.

In another embodiment of the present invention, a clock generation circuit includes: a delay line configured to delay an input clock and generate a delayed clock; a delay modeling unit configured to delay the delayed clock by a modeled delay value and generate a feedback clock; a phase detection unit configured to compare phases of the input clock and the feedback clock and generate a phase detection signal; a filter unit configured to receive the phase detection signal, generate a filter update signal and phase information, and generate a timer update signal when the filter update signal is not generated for a predetermined time; and a delay line control unit configured to set a delay value of the delay line in response to the filter update signal, the timer update signal and the phase information.

In another embodiment of the present invention, a delay control circuit includes: a phase detection unit configured to detect phases of first and second clocks and generate a phase detection signal; a filter unit configured to generate a filter update signal and phase information in response to the phase detection signal, and generate a timer update signal when the filter update signal is not generated for a predetermined time; a delay line control unit configured to set a delay value of the delay line in response to the filter update signal, the timer update signal and the phase information; and a locking detection unit configured to generate a locking signal in response to the filter update signal.

BRIEF DESCRIPTION OF THE DRAWINGS

Features, aspects, and embodiments are described in conjunction with the attached drawings, in which.

DETAILED DESCRIPTION

Hereinafter, a delay control circuit and a clock generation circuit including the same according to the present invention will be described below with reference to the accompanying drawings through various embodiments.

Figure 2:
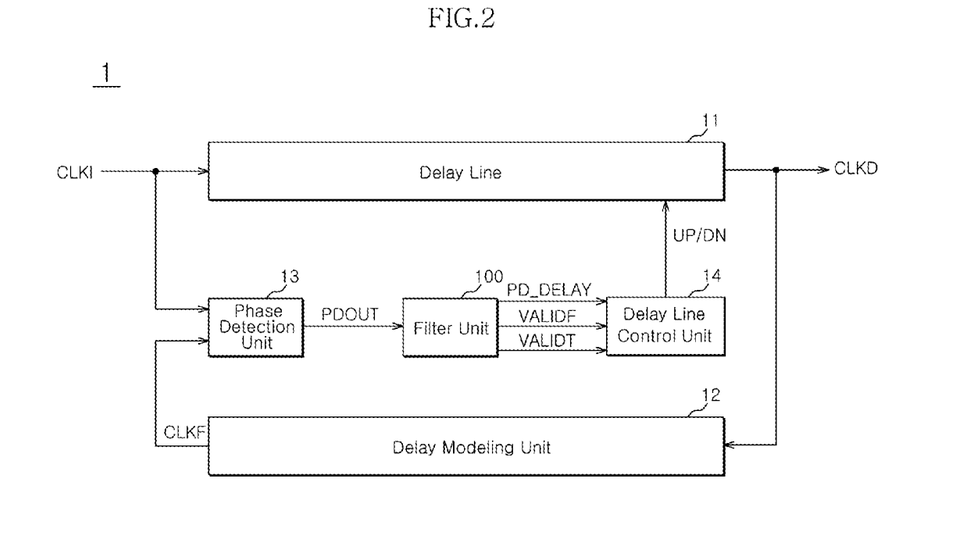
FIG. 2 is a diagram showing the configuration of a clock generation circuit in accordance with an embodiment of the present invention.

FIG. 2 is a diagram showing the configuration of a clock generation circuit 1 in accordance with an embodiment of the present invention. In FIG. 2, the clock generation circuit 1 includes a delay line 11, a delay modeling unit 12, a phase detection unit 13, a filter unit 100, and a delay line control unit 14.

The delay line 11 is configured to delay an input clock CLKI by the delay value set by the delay line control unit 14 and thereby generate the delayed clock CLKD. The delay modeling unit 12 is configured to delay the delayed clock CLKD by a modeled delay value and generate a feedback clock CLKF. The modeled delay value is the value acquired by modeling the time delay of an external clock in a semiconductor apparatus, and may be optionally set.

The phase detection unit 13 is configured to receive the input clock CLKI and the feedback clock CLKF and generate a phase detection signal PDOUT by detecting the phase difference between the two input clocks. The phase detection unit 13 may generate the phase detection signal PDOUT with a first level or a second level according to whether the feedback clock CLKF precedes or follows the input clock CLKI.

The filter unit 100 is configured to receive the phase detection signal PDOUT and generate a filter update signal VALIDF, a timer update signal VALIDT and phase information PD_DELAY. The filter unit 100 generates the filter update signal VALIDF and the phase information PD_DELAY by receiving the phase detection signal PDOUT, and generates the timer update signal VALIDT when the filter update signal VALIDF is not generated for a predetermined time. The filter unit 100 counts the number of times the phase detection signal PDOUT is generated with the first level and the second level, and generates the filter update signal VALIDF on the basis of the difference between the number of times the phase detection signal PDOUT is generated with the first level and the second level. The filter unit 100 generates the filter update signal VALIDF when the difference is greater than or equal to a threshold value, and does not generate the filter update signal VALIDF when the difference is less than the threshold value. The threshold value is a value that may be optionally set. For example, when the phase detection unit 13 detects the phase of the input clock CLKI and the feedback clock CLKF and generates the phase detection signal PDOUT with the levels of H, H, H, H, H, L, H, H, with the threshold value is set to 5, since the difference between the numbers of times the phase detection signal PDOUT is generated with the H level and the number of times the phase detection signal PDOUT is generated with the L level is 6, the filter unit 100 generates the filter update signal VALIDF and the phase information PD_DELAY indicating an H level.

However, when jitter or power noise occurs in the input clock CLKI, the phase and the duty ratio of the input clock CLKI may change. The phase detection unit 13 may then experience a dead zone or a blind zone in which it is difficult to normally detect the phases of the input clock CLKI and the feedback clock CLKF. Therefore, the phase detection unit 13 may not precisely generate the phase detection signal PDOUT due to a momentary phase change resulting from the jitter or power noise. In such a situation, the phase detection unit 13 may generate the phase detection signal PDOUT in which an H level and a L level are alternately repeated, for example, with the levels of H, L, H, L, H, H, H, L. Since the difference between the numbers of times the phase detection signal PDOUT is generated with the H level and the number of times the phase detection signal PDOUT is generated with the L level is 2, the filter unit 100 does not generate the filter update signal VALIDF. Accordingly, a stuck phenomenon is likely to occur in which the delay value of the delay line 11 cannot be updated with any information provided by the filter update signal VALIDF, due to jitter or power noise.

The filter unit 100 in accordance with an embodiment of the present invention generates the timer update signal VALIDT when the filter update signal VALIDF is not generated for a predetermined time, to prevent and/or escape the stuck phenomenon. The filter unit 100 generates the timer update signal VALIDT such that the delay line control unit 14 forcibly increases or decreases the delay value of the delay line 11 according to the phase information PD_DELAY. That is to say, the delay line control unit 14 is forced to update the delay line 11. The phase detection unit 13 receives the feedback clock CLKF, the phase of which has been modified during the update operation, and compares the feedback clock CLKF with the input clock CLKI. Thus, the phase detection unit 13 may normally generate the phase detection signal PDOUT by avoiding the stuck phenomenon due to jitter or power noise, and the filter unit 100 may generate the filter update signal VALIDF on the basis of the phase detection signal PDOUT.

Figure 3:
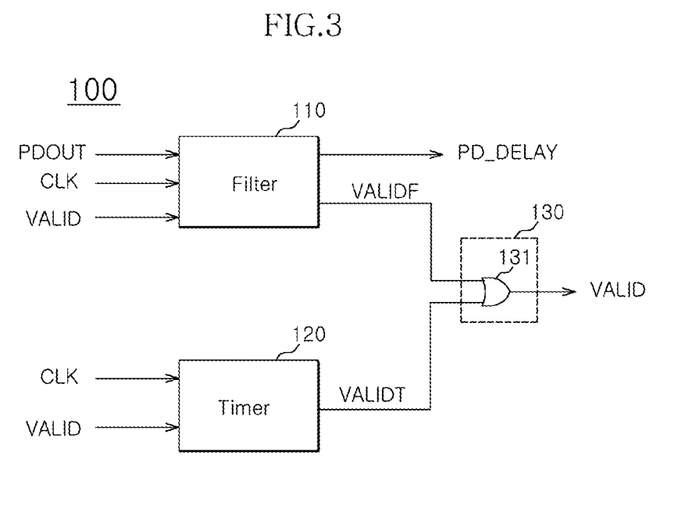
FIG. 3 is a block diagram schematically showing the configuration of the filter unit of FIG. 2.

In an embodiment of the present invention, the filter unit 100 may generate an update signal VALID in response to the filter update signal VALIDF and the timer update signal VALIDT as shown in FIG. 3. In another embodiment of the present invention, the delay line control unit 14 may generate an update signal VALID (not shown) in response to the filter update signal VALIDF and the timer update signal VALIDT. In other words, the function or configuration of generating the update signal VALID in response to the filter update signal VALIDF and the timer update signal VALIDT may be provided to the filter unit 100 or the delay line control unit 14.

The delay line control unit 14 generates a delay control signal UP/DN in response to the filter update signal VALIDF, the timer update signal VALIDT and the phase information PD_DELAY, and updates the delay value of the delay line 11. In an embodiment of the present invention, the delay line control unit 14 may change the delay value of the delay line 11 according to the phase information PD_DELAY in response to the update signal VALID generated on the basis of the filter update signal VALIDF and the timer update signal VALIDT.

FIG. 3 is a block diagram schematically showing the configuration of an embodiment of the filter unit 100 of FIG. 2. In FIG. 3, the filter unit 100 includes a filter 110 and a timer 120. The filter 110 is configured to receive the phase detection signal PDOUT and a clock CLK and generate the phase information PD_DELAY and the filter update signal VALIDF. The filter 110 receives the clock CLK to synchronize the phase information PD_DELAY and the filter update signal VALIDF when generating the phase information PD_DELAY and the filter update signal VALIDF. The input clock CLKI may be used as the clock CLK without limitation. Further, the filter 110 may be reset when the update signal VALID is received. The filter 110 counts the phase detection signal PDOUT of the first level and the second level and resets a counting value in response to the update signal VALID. Namely, the filter 110 is configured to be reset when the delay value of the delay line 11 is updated by the delay line control unit 14 as the update signal VALID is generated.

The timer 120 is configured to generate the timer update signal VALIDT in response to the clock CLK and the update signal VALID. The timer 120 delays and divides the clock CLK and generates the timer update signal VALIDT which is enabled after the lapse of the predetermined time, on the basis of the delayed and divided clock. The timer 120 may be reset in response to the update signal VALID. When the timer 120 is reset by the update signal VALID, the timer 120 generates again the timer update signal VALIDT after the lapse of the predetermined time. Hence, if the filter update signal VALIDF is generated within the predetermined time, the update signal VALID is generated on the basis of the filter update signal VALIDF, and the timer 120 does not generate the timer update signal VALIDT.

In FIG. 3, the filter unit 100 may further include a signal combining part 130. The signal combining part 130 is configured to receive the filter update signal VALIDF and the timer update signal VALIDT and generate the update signal VALID. The signal combining part 130 generates the update signal VALID on the basis of at least one of the filter update signal VALIDF and the timer update signal VALIDT. In FIG. 3, the signal combining part 130 includes an OR gate 131, which enables the update signal VALID when one of the filter update signal VALIDF and the timer update signal VALIDT is enabled. In FIG. 3, while the signal combining part 130 is illustrated as being included in the filter unit 100, the present invention is not limited to such. In an embodiment of the present invention, the signal combining part 130 may be included in the delay line control unit 14.

Figure 4:
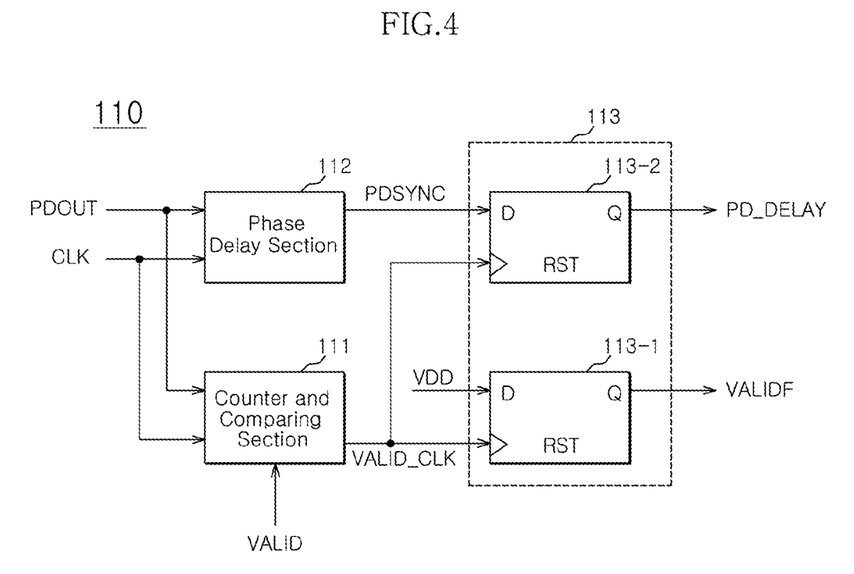
FIG. 4 is a diagram showing the configuration of the filter of FIG. 3.

FIG. 4 is a diagram showing the configuration of an embodiment of the filter 110 of FIG. 3. In FIG. 4, the filter 110 includes a counter and comparing section 111, a phase delay section 112 and a synchronizing section 113. The counter and comparing section 111 receives the phase detection signal PDOUT and the clock CLK. The counter and comparing section 111 is configured to receive the phase detection signal PDOUT and the clock CLK and count the number of times the phase detection signal PDOUT with the first level and the second level has been generated. The counter and comparing section 111 generates an update pulse VALID_CLK if the difference between the numbers of phase detection signals with a first level generated and the number of phase detection signals with a second level generated is greater than or equal to the threshold value. The counter and comparing section 111 does not generate the update pulse VALID_CLK if the difference between the numbers of phase detection signals with a first level generated and the number of phase detection signals with a second level generated is less than the threshold value. The counter and comparing section 111 may reset a counting value in response to the update signal VALID.

The phase delay section 112 is configured to receive the phase detection signal PDOUT and the clock CLK and generate a phase synchronization signal PDSYNC. The delay value of the phase delay section 112 is a value acquired by modeling a time for which the counter and comparing section 111 counts the phase detection signal PDOUT. The phase delay section 112 is to provide phase information synchronized with the filter update signal VALIDF when the filter update signal VALIDF is generated. Thus, the phase delay section 112 delays the phase detection signal PDOUT by the time delayed in the counter and comparing section 111 while counting the number of times the phase detection signal PDOUT has been generated, and generates the phase synchronization signal PDSYNC.

The synchronizing section 113 is configured to receive the update pulse VALID_CLK and the phase synchronization signal PDSYNC and generate the filter update signal VALIDF and the phase information PD_DELAY. The synchronizing section 113 generates the filter update signal VALIDF from the update pulse VALID_CLK, and generates the phase information PD_DELAY by synchronizing the phase synchronization signal PDSYNC with the update pulse VALID_CLK.

In FIG. 4, the synchronizing section 113 includes first and second flip-flops 113-1 and 113-2. The first flip-flop 113-1 receives an external voltage VDD through an input terminal and the update pulse VALID_CLK through a clock terminal, and generates the filter update signal VALIDF through an output terminal. Accordingly, the first flip-flop 113-1 may generate the filter update signal VALIDF if the update pulse VALID_CLK is generated. The second flip-flop 113-2 receives the phase synchronization signal PDSYNC through an input terminal and the update pulse VALID_CLK through a clock terminal, and outputs the phase information PD_DELAY through an output terminal. The second flip-flop 113-2 provides the phase synchronization signal PDSYNC as the phase information PD_DELAY when the update pulse VALID_CLK is received. Accordingly, the second flip-flop 113-2 may output the phase information PD_DELAY in synchronization with a time at which the filter update signal VALIDF is outputted.

Figure 5:
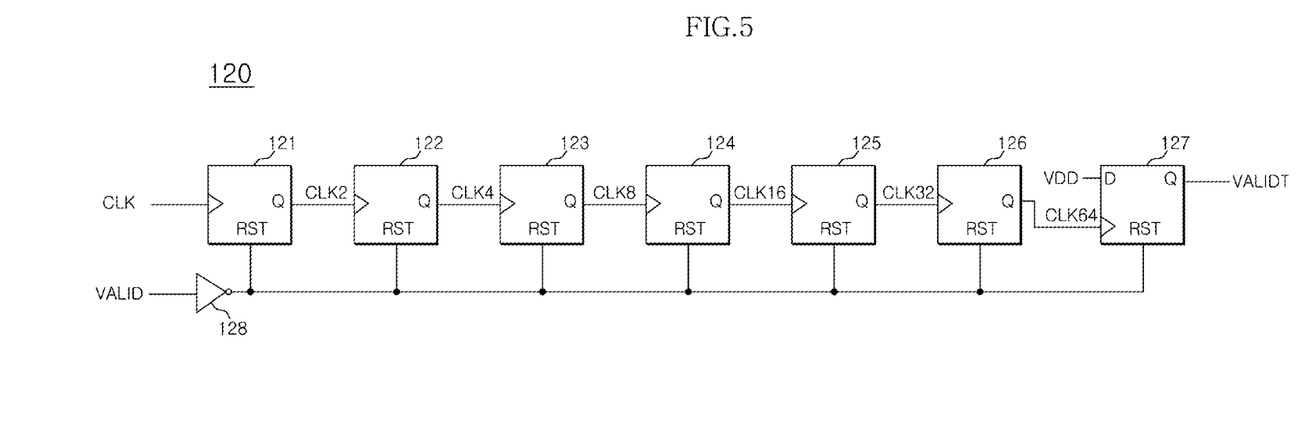
FIG. 5 is a diagram showing the configuration of the timer of FIG. 3.

FIG. 5 is a diagram showing the configuration of an embodiment of the timer 120 of FIG. 3. In FIG. 5, the timer 120 includes a plurality of flip-flops 121 to 127 and an inverter 128. The timer 120 includes six T flip-flops 121 to 126 connected in series and one D flip-flops 127. The first T flip-flop 121 receives the clock CLK and generates a delayed clock CLK2. As the clock CLK passes through subsequent flip-flops, it is divided. Thus, time clocks CLK2, CLK4, CLK8, CLK16, CLK32 and CLK64 are output from the respective T flip-flops 121 to 126. The delayed clock CLK64 which has passed the six T flip-flops 121 to 126 may be a signal which is acquired by dividing the clock CLK by 64. The D flip-flop 127 receives the delayed clock CLK64 and outputs the timer update signal VALIDT. The flip-flops 121 to 127 are reset in response to the update signal VALID. Since the inverter 128 receives and inverts the update signal VALID, the flip-flops 121 to 127 are reset by receiving the output of the inverter 128 through the reset terminals thereof. Therefore, the timer 120 may generate the timer update signal VALIDT after the lapse of the predetermined time by delaying the clock CLK. The present invention is not limited to 7 flip-flops that are used to constitute the timer 120, and it is to be noted that the number of flip-flops may be increased or decreased to change the predetermined time.

Figure 6:
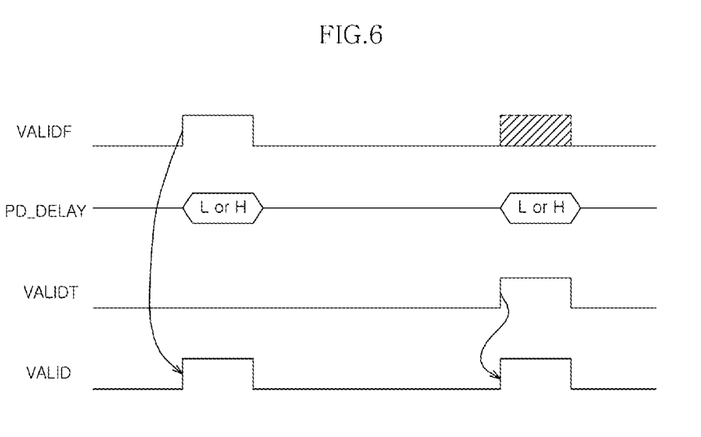
FIG. 6 is a timing diagram showing operations of the clock generation circuit in accordance with the embodiment of the present invention shown in FIG. 2.

FIG. 6 is a timing diagram showing operations of the clock generation circuit 1 in accordance with an embodiment of the present invention. The operations of the clock generation circuit 1 in accordance with the embodiment of the present invention will be described below with reference to FIGS. 2 to 6. When the phase detection unit 13 detects the phases of the input clock CLKI and the feedback clock CLKF and the filter unit 100 normally generates the filter update signal VALIDF, the update signal VALID is generated on the basis of the filter update signal VALIDF. The delay line control unit 14 newly sets the delay value of the delay line 11 according to the phase information PD_DELAY when the update signal VALID is generated.

Afterwards, if a stuck phenomenon occurs, the filter unit 100 may not normally generate the filter update signal VALIDF by receiving the phase detection signal PDOUT. In FIG. 6, a situation where the filter update signal VALIDF is not generated is represented by the hatching lines. If the filter update signal VALIDF is not generated for the predetermined time, the timer update signal VALIDT is generated by the timer 120. If the update signal VALID is generated on the basis of the timer update signal VALIDT, the delay line control unit 14 updates the delay value of the delay line 11 according to the phase information PD_DELAY. The timer 120 is reset in response to the update signal VALID.

Figure 7:
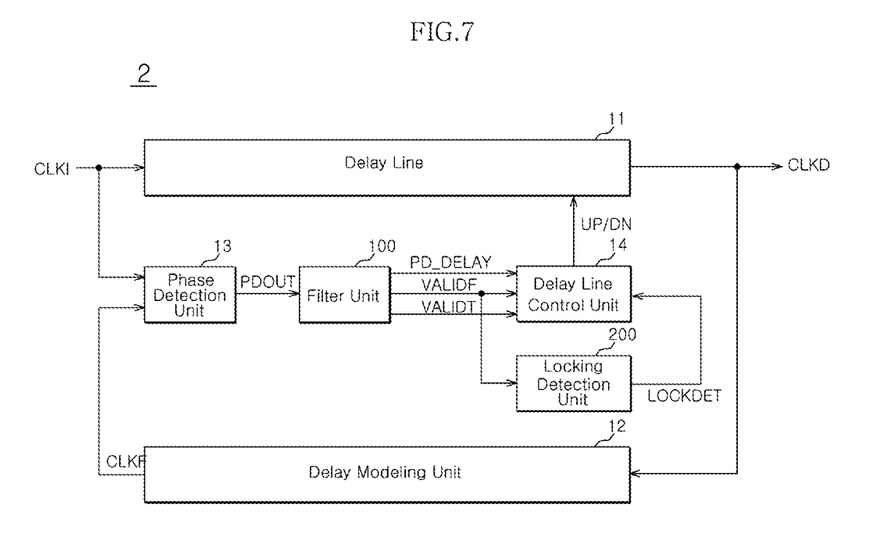
FIG. 7 is a diagram showing the configuration of a clock generation circuit in accordance with another embodiment of the present invention.

FIG. 7 is a diagram showing the configuration of a clock generation circuit 2 in accordance with another embodiment of the present invention. The clock generation circuit 2 of FIG. 7 further includes a locking detection unit 200 in addition to the components of the clock generation circuit 1 according to a embodiment of the present invention. A delay line 11, a delay modeling unit 12, a phase detection unit 13, a filter unit 100 and a delay line control unit 14 of the clock generation circuit 2 shown in FIG. 7 are equivalent to those of the clock generation circuit 1 of FIG. 2.

The locking detection unit 200 is configured to receive the filter update signal VALIDF and generate a locking signal LOCKDET. The locking signal LOCKDET is a signal to indicate the completion of a delay locking operation and locking the delay value of the delay line 11. The locking signal LOCKDET may be generated to indicate the completion of a coarse delay operation for the input clock CLKI and instruct a fine delay operation. The delay line control unit 14 does not update and locks the delay value of the delay line in response to the locking signal LOCKDET.

The locking detection unit 200 generates the locking signal LOCKDET in response to the filter update signal VALIDF and does not generate the locking signal LOCKDET in response to the timer update signal VALIDT. That is to say, the locking signal LOCKDET is not generated by the update signal VALID which is generated on the basis of the timer update signal VALIDT. Therefore, while the clock generation circuit 2 performs the update operation of changing the delay value of the delay line 11 in response to any one of the filter update signal VALIDF and the timer update signal VALIDT, the clock generation circuit 1 performs the locking operation in response to only the filter update signal VALIDF.

In the clock generation circuit 1 shown in FIG. 2, when the filter update signal VALIDF is not generated as a stuck phenomenon occurs, the update operation is forcibly performed by generating the update signal VALID from the timer update signal VALIDT, to escape the stuck phenomenon. However, since the timer update signal VALIDT is a signal which is generated regardless of the phase detection signal PDOUT, the delay locking operation may be erroneously performed when the locking signal LOCKDET is generated from the update signal VALID generated on the basis of the timer update signal VALIDT. In other words, while the rising edges of the input clock CLKI and the feedback clock CLKF should be synchronized with each other, when the rising edge of the input clock CLKI and the falling edge of the feedback clock CLKF are synchronized with each other or the falling edge of the input clock CLKI and the rising edge of the feedback clock CLKF are synchronized with each other, the locking signal LOCKDET may be erroneously generated. Namely, a half lock phenomenon is likely to occur. Hence, the clock generation circuit 2 in accordance with an embodiment of the present invention generates the locking signal LOCKDET on the basis of only the filter update signal VALIDF. Since this filter update signal VALIDF is a signal which is generated by normally counting the phase detection signal PDOUT generated from the phase detection unit 13, it is possible to prevent the half lock phenomenon from occurring.

Figure 8:
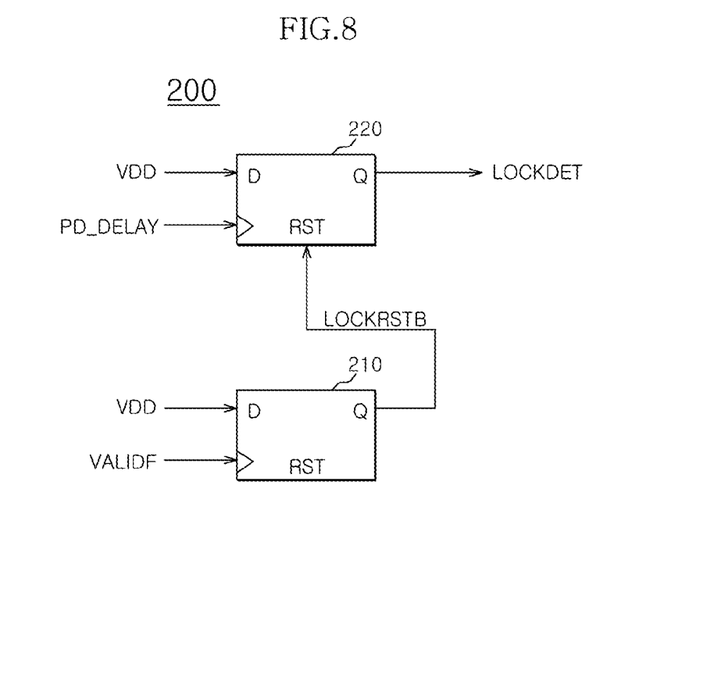
FIG. 8 is a diagram showing the configuration of the locking detection unit of FIG. 7.

FIG. 8 is a diagram showing the configuration of an embodiment of the locking detection unit 200 of FIG. 7. In FIG. 8, the locking detection unit 200 includes third and fourth flip-flops 210 and 220. The third flip-flop 210 receives the external voltage VDD through an input terminal, the filter update signal VALIDF through a clock terminal, and generates a locking pulse LOCKRSTB through an output terminal. Accordingly, the third flip-flop 210 generates the locking pulse LOCKRSTB when the filter update signal VALIDF is received.

The fourth flip-flop 220 receives the external voltage VDD through an input terminal and the phase information PD_DELAY through a clock terminal, and generates the locking signal LOCKDET through the output terminal. Further, the fourth flip-flop 220 receives the locking pulse LOCKRSTB through a reset terminal. The fourth flip-flop 220 is maintained in a reset state until the locking pulse LOCKRSTB is generated. If the locking pulse LOCKRSTB is received, the reset state of the fourth flip-flop 220 is released. At this time, when the phase information PD_DELAY is applied to change a low level to a high level, the fourth flip-flop 220 may generate the locking signal LOCKDET with the level of the external voltage VDD. The locking signal LOCKDET is inputted to the delay line control unit 14 and indicates the completion of the delay locking operation.

Figure 9:
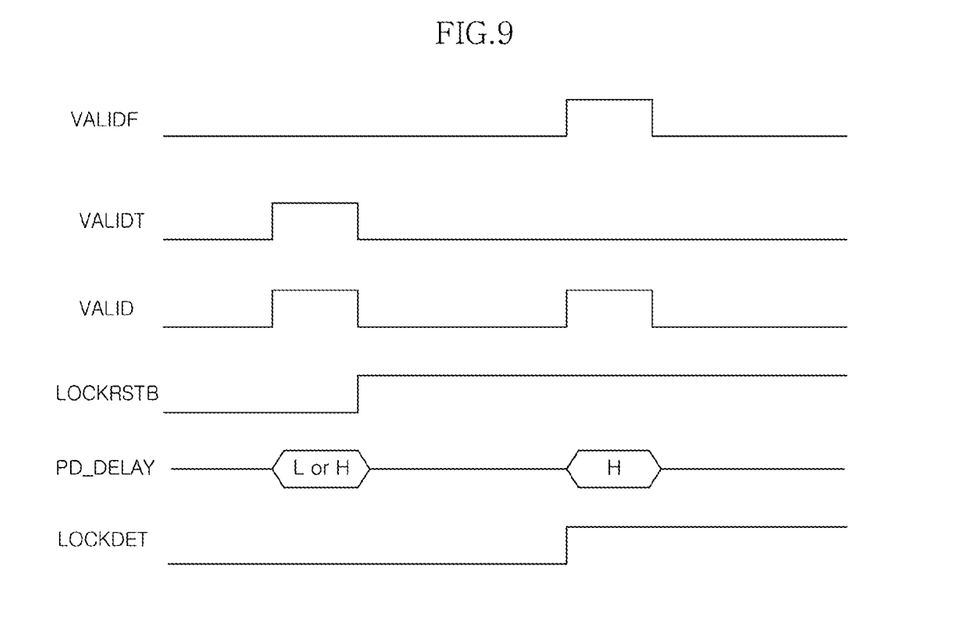
FIG. 9 is a timing diagram showing a situation where a half lock phenomenon occurs when a locking signal is generated on the basis of a timer update signal.
Figure 10:
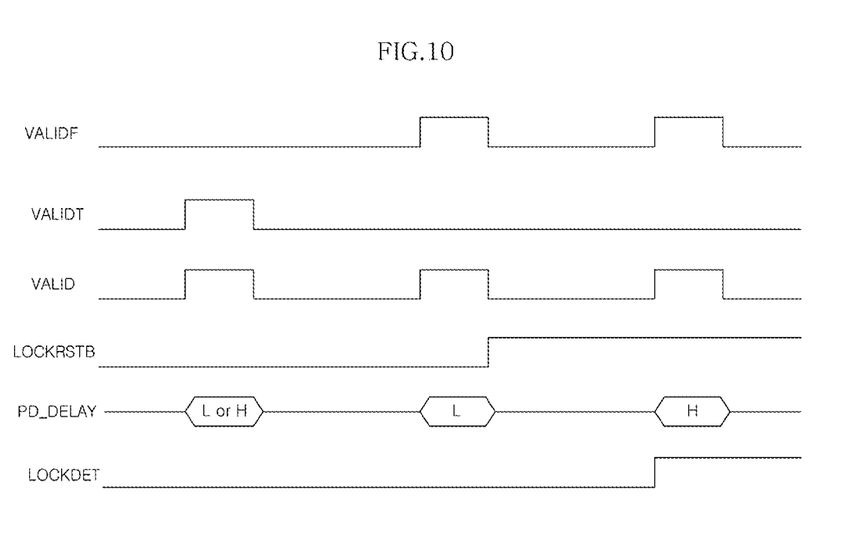
FIG. 10 is a timing diagram showing operations of the clock generation circuit in accordance with an embodiment of the present invention shown in FIG. 7.

FIG. 9 is a timing diagram showing a situation where a half lock phenomenon occurs when the locking signal LOCKDET is generated on the basis of the timer update signal VALIDT, and FIG. 10 is a timing diagram showing operations of the clock generation circuit 2 in accordance with an embodiment of the present invention. Operations of the clock generation circuit 2 in accordance with an embodiment of the present invention will be described below with reference to FIGS. 7 to 10.

In FIG. 9, the locking detection unit 200 generates the locking signal LOCKDET in response to the update signal VALID generated on the basis of both the filter update signal VALIDF and the timer update signal VALIDT. If a stuck phenomenon occurs and the timer update signal VALIDT is generated, the third flip-flop 210 of the locking detection unit 200 generates the locking pulse LOCKRSTB in response to the update signal VALID indicating the update operation, and the reset state of the fourth flip-flop 220 is released in response to the locking pulse LOCKRSTB. Thereafter, if the update signal VALID is generated as the filter update signal VALIDF is generated from the filter unit 100, the fourth flip-flop 220 of the locking detection unit 200 generates the locking signal LOCKDET according to the phase information PD_DELAY. If the locking detection unit 200 receives the phase information PD_DELAY of the high level in the update operation by the filter update signal VALIDF, the fourth flip-flop 220 of the locking detection unit 200 assumes that the phase information PD_DELAY has normally transitioned from the low level to the high level, and enables the locking signal LOCKDET. In this case, the half lock phenomenon may occur as described above. Thus, the locking detection unit 200 of the clock generation circuit 2 in accordance with an embodiment of the present invention generates the locking signal LOCKDET on the basis of the filter update signal VALIDF.

As can be seen from FIG. 10, even when the update operation is performed according to the timer update signal VALIDT, the third flip-flop 210 of the locking detection unit 200 does not generate the locking pulse LOCKRSTB. Thereafter, if the filter update signal VALIDF is generated from the filter unit 100, the third flip-flop 210 of the locking detection unit 200 generates the locking pulse LOCKRSTB and releases the reset state of the fourth flip-flop 220. Afterwards, when the filter update signal VALIDF is generated and the phase information PD_DELAY transitions from the low level to the high level, the fourth flip-flop 220 of the locking detection unit 200 enables the locking signal LOCKDET. The locking signal LOCKDET is inputted to the delay line control unit 14 and indicates the completion of the delay locking operation. The clock generation circuit 2 in accordance with an embodiment of the present invention may release the reset state of the fourth flip-flop 220 of the locking detection unit 200 only when the phase detection of the input clock CLKI and the feedback clock CLKF is normally performed and the filter update signal VALIDF is generated. Therefore, only when it is confirmed that the phase information PD_DELAY normally transitions from the low level to the high level, will the locking signal LOCKDET generated, thereby possibly preventing the half lock phenomenon from occurring.

While certain embodiments have been described above, it will be understood to those skilled in the art that the embodiments described are by way of example only. Accordingly, the delay control circuit and the clock generation circuit including the same described herein should not be limited based on the described embodiments. Rather, the delay control circuit and the clock generation circuit including the same described herein should only be limited in light of the claims that follow when taken in conjunction with the above description and accompanying drawings.

What is claimed is:

1. A clock generation circuit comprising:
   a delay line configured to delay an input clock and generate a delayed clock;
   a delay modeling unit configured to delay the delayed clock by a modeled delay value and generate a feedback clock;
   a phase detection unit configured to compare phases of the input clock and the feedback clock and generate a phase detection signal;
   a filter unit configured to receive the phase detection signal and generate phase information, generate an update signal when a difference between the number of phase detection signals with a first level generated and the number of phase detection signals with a second level generated is greater than or equal to a threshold value, and generate the update signal after a lapse of a predetermined time when the difference is less than the threshold value; and
   a delay line control unit configured to set a delay value of the delay line in response to the update signal and the phase information.

2. The clock generation circuit according to claim 1, wherein the filter unit comprises:
   a filter configured to generate a filter update signal and the phase information in response to the phase detection signal;
   a timer configured to generate a timer update signal in response to a clock and the update signal; and
   a signal combining part configured to generate the update signal in response to the filter update signal and the timer update signal.

3. The clock generation circuit according to claim 2, wherein the filter comprises:
   a counter and comparing section configured to count the number of times the phase detection signal with the first level and the second level has been generated, and generate an update pulse on the basis of the difference;
   a phase delay section configured to delay the phase detection signal and generate a phase synchronization signal; and
   a synchronizing section configured to receive the update pulse and the phase synchronization signal and generate the filter update signal and the phase information.

4. The clock generation circuit according to claim 3, wherein the counter and comparing section generates the update pulse when the difference between the number of times the phase detection signal is generated with the first level and the number of times the phase detection signal is generated with the second level is greater than or equal to the threshold value, and does not generate the update pulse when the difference is less than the threshold value.

5. The clock generation circuit according to claim 3, wherein a delay value of the phase delay section is set by modeling a time during which the counter and comparing section counts the phase detection signal.

6. The clock generation circuit according to claim 3, wherein the timer generates the timer update signal after the lapse of the predetermined time by delaying the clock, and is reset in response to the update signal.

7. The clock generation circuit according to claim 3, wherein the synchronizing section comprises:
   a first signal generation part configured to generate the filter update signal in response to the update pulse; and
   a second signal generation part configured to provide the phase synchronization signal as the phase information in response to the update pulse.

8. A clock generation circuit comprising:
   a delay line configured to delay an input clock and generate a delayed clock;
   a delay modeling unit configured to delay the delayed clock by a modeled delay value and generate a feedback clock;
   a phase detection unit configured to compare phases of the input clock and the feedback clock and generate a phase detection signal;
   a filter unit configured to receive the phase detection signal, generate a filter update signal and phase information, and generate a timer update signal when the filter update signal is not generated for a predetermined time; and
   a delay line control unit configured to set a delay value of the delay line in response to the filter update signal, the timer update signal and the phase information.

9. The clock generation circuit according to claim 8, wherein the filter unit generates the filter update signal when a difference between the number of times the phase detection signal is generated with the first level and the number of times the phase detection signal is generated with the second level is greater than or equal to a threshold value, and generates the timer update signal after a lapse of the predetermined time when the difference is less than the threshold value.

10. The clock generation circuit according to claim 8, further comprising:
    a locking detection unit configured to generate a locking signal in response to the filter update signal.

11. The clock generation circuit according to claim 8, wherein the filter comprises:
    a counter and comparing section configured to count the number of times the phase detection signal with the first level and the second level has been generated, and generate an update pulse on the basis of the difference;
    a phase delay section configured to delay the phase detection signal and generate a phase synchronization signal; and a synchronizing section configured to receive the update pulse and the phase synchronization signal and generate the filter update is signal and the phase information.

12. The clock generation circuit according to claim 11, wherein the counter and comparing section generates the update pulse when the difference between the number of times the phase detection signal is generated with the first level and the number of times the phase detection signal is generated with the second level is greater than or equal to the threshold value, and does not generate the update pulse when the difference is less than the threshold value.

13. The clock generation circuit according to claim 11, wherein a delay value of the phase delay section is set by modeling a time during which the counter and comparing section counts the phase detection signal.

14. The clock generation circuit according to claim 11, wherein the synchronizing section comprises:
a first signal generation part configured to generate the filter update signal in response to the update pulse; and
a second signal generation part configured to provide the phase synchronization signal as the phase information in response to the update pulse.

15. The clock generation circuit according to claim 8, wherein the delay line control unit sets the delay value of the delay line according to the phase information in response to at least one of the filter update signal and the timer update signal.

16. The clock generation circuit according to claim 8, wherein the filter unit comprises:
a filter configured to generate the filter update signal and the phase information in response to the phase detection signal; and
a timer configured to generate the timer update signal in response to a clock and an update signal.

17. The clock generation circuit according to claim 16, wherein the delay control unit comprises a signal combining part configured to generate the update signal in response to the filter update signal and the timer update signal, and sets the delay value of the delay line in response to the update signal and the phase information.

18. The clock generation circuit according to claim 17, wherein the timer generates the timer update signal after the lapse of the predetermined time by delaying the clock, and is reset in response to the update signal.

19. A delay control circuit comprising:
a phase detection unit configured to detect phases of first and second clocks and generate a phase detection signal;
a filter unit configured to generate a filter update signal and phase information in response to the phase detection signal, and generate a timer update signal when the filter update signal is not generated for a predetermined time;
a delay line control unit configured to set a delay value of the delay line in response to the filter update signal, the timer update signal and the phase information; and
a locking detection unit configured to generate a locking signal in response to the filter update signal.

20. The delay control circuit according to claim 19, wherein the filter unit generates the filter update signal when a difference between the number of times the phase detection signal is generated with the first level and the number of times the phase detection signal is generated with the second level is greater than or equal to a threshold value, and generates the timer update signal after the lapse of the predetermined time when the difference is less than the threshold value.

21. The delay control circuit according to claim 19, wherein the delay line control unit sets the delay value of the delay line according to the phase information in response to at least one of the filter update signal and the timer update signal.

22. The delay control circuit according to claim 19, wherein the filter unit comprises:
a filter configured to generate the filter update signal and the phase information in response to the phase detection signal; and
a timer configured to generate the timer update signal in response to a clock and an update signal.

23. The delay control circuit according to claim 22, wherein the delay control unit comprises a signal combining part configured to generate the update signal in response to the filter update signal and the timer update signal, and sets the delay value of the delay line in response to the update signal and the phase information.

24. The delay control circuit according to claim 23, wherein the timer generates the timer update signal after the lapse of the predetermined time by delaying the clock, and is reset in response to the update signal.

25. The delay control circuit according to claim 22, wherein the filter comprises:
a counter and comparing section configured to count the number of times the phase detection signal with the first level and the second level has been generated, and generate an update pulse on the basis of the difference;
a phase delay section configured to delay the phase detection signal and generate a phase synchronization signal; and
a synchronizing section configured to receive the update pulse and the phase synchronization signal and generate the filter update signal and the phase information.

26. The delay control circuit according to claim 25, wherein the counter and comparing section generates the update pulse when the difference between the number of times the phase detection signal is generated with the first level and the number of times the phase detection signal is generated with the second level is greater than or equal to the threshold value, and does not generate the update pulse when the difference is less than the threshold value.

27. The delay control circuit according to claim 25, wherein a delay value of the phase delay section is set by modeling a time during which the counter and comparing section counts the phase detection signal.

28. The delay control circuit according to claim 25, wherein the synchronizing section comprises:
a first signal generation part configured to generate the filter update signal in response to the update pulse; and
a second signal generation part configured to provide the phase synchronization signal as the phase information in response to the update pulse.

* * * * *